United States Patent
Naffziger

(10) Patent No.: US 7,323,920 B2
(45) Date of Patent: Jan. 29, 2008

(54) SOFT-ERROR RATE IMPROVEMENT IN A LATCH USING LOW-PASS FILTERING

(75) Inventor: Samuel D. Naffziger, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 93 days.

(21) Appl. No.: 11/152,274

(22) Filed: Jun. 13, 2005

(65) Prior Publication Data

US 2006/0279343 A1 Dec. 14, 2006

(51) Int. Cl.
*H03K 3/356* (2006.01)

(52) U.S. Cl. .................... 327/210; 327/211

(58) Field of Classification Search ........... 327/200, 327/201, 205, 206, 208–215
See application file for complete search history.

(56) References Cited

U.S. PATENT DOCUMENTS

| | | | | |
|---|---|---|---|---|
| 5,760,618 | A * | 6/1998 | Deliyannides et al. | 327/108 |
| 6,026,011 | A * | 2/2000 | Zhang | 365/154 |
| 6,384,620 | B1 * | 5/2002 | Yamada et al. | 326/29 |
| 6,472,919 | B1 * | 10/2002 | Burr | 327/210 |
| 6,573,774 | B1 * | 6/2003 | Gardner | 327/201 |
| 7,068,088 | B2 * | 6/2006 | Petersen | 327/208 |
| 7,132,871 | B2 * | 11/2006 | Arima et al. | 327/208 |
| 2003/0102897 | A1 * | 6/2003 | Hannum et al. | 327/205 |

* cited by examiner

*Primary Examiner*—Kenneth B. Wells
*Assistant Examiner*—Thomas J. Hiltunen

(57) ABSTRACT

In a preferred embodiment, the invention provides a circuit and method for reducing soft error events in latches. A low-pass filter is placed between the output of a forward inverter and the inputs of a feedback keeper. The first and second outputs of the low-pass filter are connected to first and second inputs respectively of the feedback keeper. The only type of diffusion connected to the first output of the low-pass filter is a P-type diffusion. The only type of diffusion connected to the second output of the low-pass filter is an N-type diffusion. The feedback keeper is connected to an input of the forward inverter.

19 Claims, 8 Drawing Sheets

SOFT-ERROR RATE IMPROVEMENT IN A LATCH USING LOW-PASS FILTERING

FIELD OF THE INVENTION

This invention relates generally to latch design. More particularly, this invention relates to improving soft error immunity in latches.

BACKGROUND OF THE INVENTION

High-energy neutrons lose energy in materials mainly through collisions with silicon nuclei that lead to a chain of secondary reactions. These reactions deposit a dense track of electron-hole pairs as they pass through a p-n junction. Some of the deposited charge will recombine, and some will be collected at the junction contacts. When a particle strikes a sensitive region of a latch, the charge that accumulates could exceed the minimum charge that is needed to "flip" the value stored on the latch, resulting in a soft error.

The smallest charge that results in a soft error is called the critical charge of the latch. The rate at which soft errors occur (SER) is typically expressed in terms of failures in time (FIT).

A common source of soft errors are alpha particles which may be emitted by trace amounts of radioactive isotopes present in packing materials of integrated circuits. "Bump" material used in flip-chip packaging techniques has also been identified as a possible source of alpha particles.

Other sources of soft errors include high-energy cosmic rays and solar particles. High-energy cosmic rays and solar particles react with the upper atmosphere generating high-energy protons and neutrons that shower to the earth. Neutrons can be particularly troublesome as they can penetrate most man-made construction (a neutron can easily pass through five feet of concrete). This effect varies with both latitude and altitude. In London, the effect is two times worse than on the equator. In Denver, Colo. with its mile-high altitude, the effect is three times worse than at sea-level San Francisco. In a commercial airplane, the effect can be 100-800 times worse than at sea-level.

Radiation induced soft errors are becoming one of the main contributors to failure rates in microprocessors and other complex ICs (integrated circuits). Several approaches have been suggested to reduce this type of failure. Adding ECC (Error Correction Code) or parity in data paths approaches this problem from an architectural level. Adding ECC or parity in data paths can be complex and costly.

At the circuit level, SER may be reduced by increasing the ratio of capacitance created by oxides to the capacitance created by p/n junctions. The capacitance in a latch, among other types, includes capacitance created by p/n junctions and capacitance created by oxides. Since electron/hole pairs are created as high-energy neutrons pass through a p/n junction, a reduction in the area of p/n junctions in a latch typically decreases the SER. Significant numbers of electron/hole pairs are not created when high-energy neutrons pass through oxides. As a result, the SER may typically be reduced by increasing the ratio of oxide capacitance to p/n junction capacitance in a SRAM cell.

There is a need in the art to reduce the SER in latches. An embodiment of this invention reduces the SER in latches using low-pass feedback, and N diffusion only and P diffusion only feedback paths to the feedback keeper.

DETAILED DESCRIPTION OF THE PREFERRED EMBODIMENT

Figure 1:
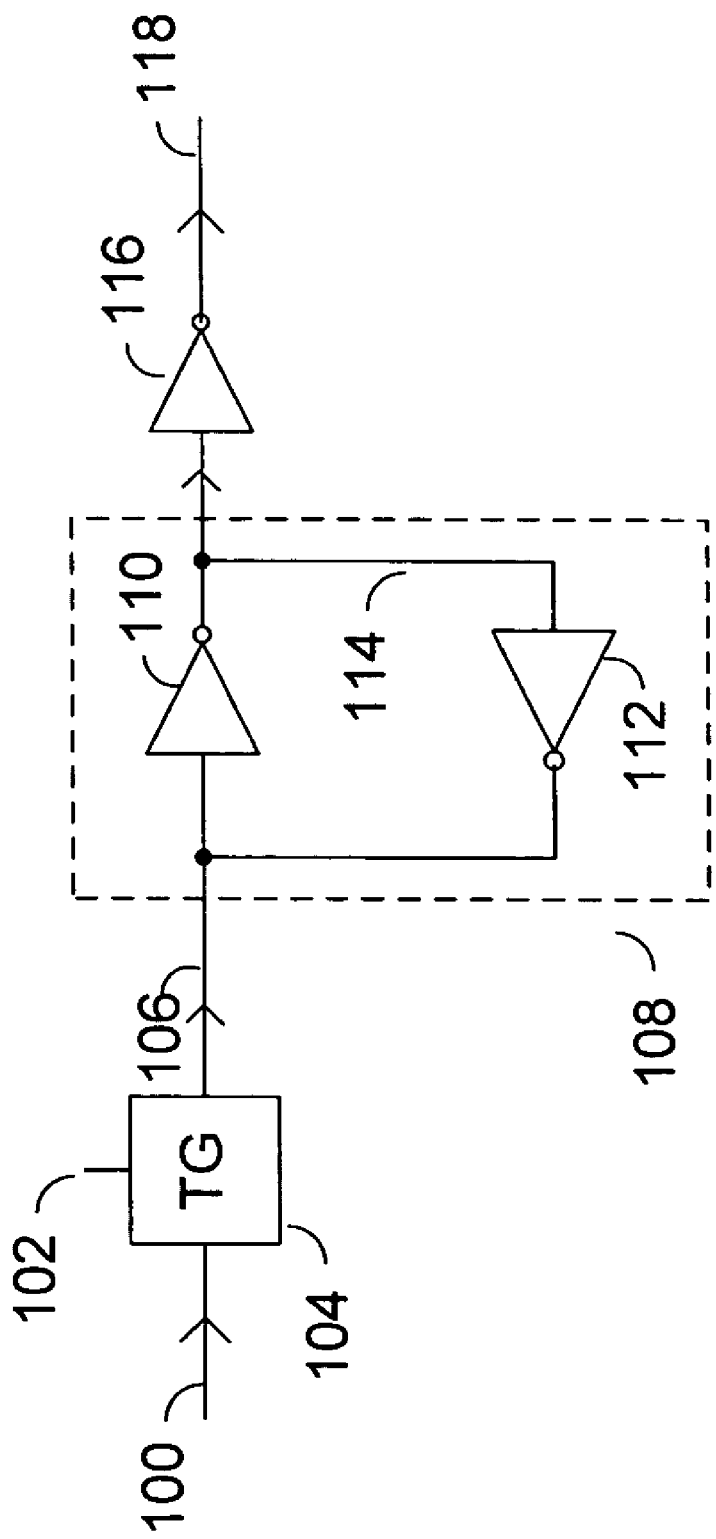
FIG. 1 is a schematic diagram of a transfer gate, a latch, and an inverter. Prior Art

FIG. 1 is a schematic diagram of a transfer gate, 104, a latch, 108, and an inverter, 116. An input, 100, is connected to the input of transfer gate, 104. The output, 106, of the transfer gate, 104, is connected to the input, 106, of the latch, 108. Control signal, 102, controls when the signal on the input, 100, of the transfer gate, 104, is transferred to the output, 106, of the transfer gate, 104. The signal presented at the output, 106, is stored on the latch, 108. The signal, 106, stored on the latch, 108, drives the input, 114, of the inverter, 116. In this example, the output, 118, of the inverter, 116, has the same sense of the signal stored on the latch, 108. In this example, a latch comprises a forward inverter, 110 and a feedback keeper, 112, where the output, 114, of the forward inverter, 110, is connected to input, 114, of the feedback keeper, 112 and the output, 106, of the feedback keeper, 112, is connected to the input, 106, of the forward inverter, 110. The drive strength of the feedback inverter, 112, is usually just strong enough to overcome the charge leakage on the input of the latch, 106. In addition, the write time of the latch, 108, can be shorter when the drive strength of the feed back inverter, 112, is low.

After control signal, 102, is turned off, the original logical value on node 106 of the latch, 108, is usually retained. If, however, a soft error event disturbs the charge stored on the node 106, the original logical value may be lost because the feedback inverter, 112, is not strong enough to recover node 106 to its original value. Also, the output, 118, of inverter, 116, may be changed from its original logical value. If, for example, a soft error event disturbs the charge stored on node, 114, the original value may be lost because the feedback inverter, 112, drives node 106 to a logical value different from its original logical value. Also, the output, 118, of inverter, 116, may be changed from its original logical value. If the drive strength of feedback inverter, 112, is increased, and a soft error disturbs node 106, the probability that node 106 will change from its original value is decreased. However, if the driver strength of feedback inverter, 112, is increased, and a soft error disturbs node 114, the probability that node 106 will change from its original value is increased. In addition, because the drive strength of the feedback inverter, 112, has been increased, the write time of the latch 108 may be increased.

Figure 2:
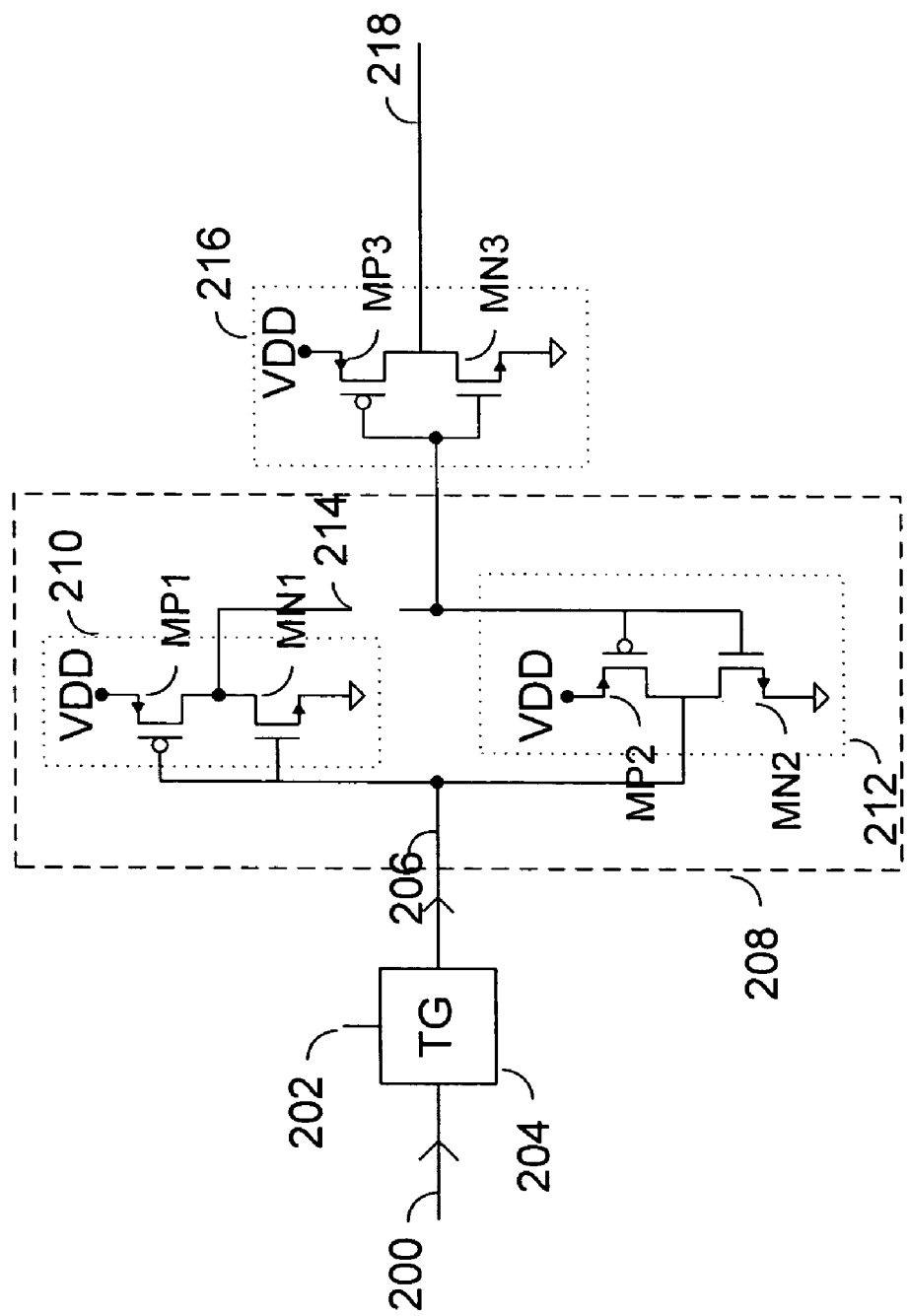
FIG. 2 is a schematic diagram of a transfer gate, a latch, and an inverter. Prior Art

FIG. 2 is a schematic diagram of a transfer gate, 204, a latch, 208, and an inverter, 216. An input, 200, is connected to the input of transfer gate, 204. The output, 206, of the transfer gate, 204, is connected to the input of the latch, 208. Control signal, 202, controls when the signal on the input, 200, of the transfer gate, 204, is transferred to the output, 206, of the transfer gate, 204. The signal presented at the output, 206, is stored on the latch, 208. The signal, 206, stored on the latch, 208, drives the input, 214, of the inverter, 216. In this example, the output, 218, of the inverter, 216, has the same sense of the signal stored on the latch, 208. The drive strength of the feedback inverter, 212, is usually just strong enough to overcome the charge leakage on the input of the latch, 206. In addition, the write time of the latch, 108, can be shorter when the drive strength of the feed back inverter, 112, is low.

In this example, a latch, 208, comprises a forward inverter, 210 and a feedback keeper, 212, where the output, 214, of the forward inverter, 210, is connected to input, 214, of the feedback keeper, 212 and the output, 206, of the feedback keeper, 212, is connected to the input, 206, of the forward inverter, 210. In this example, forward inverter 210 comprises a PFET, MP1, and an NFET, MN1. The gates, 206, of PFET, MP1, and NFET, MN1, are connected. The source of PFET, MP1, is connected to VDD and the source of NFET, MN1, is connected to GND. The drains of PFET, MP1, and NFET, MN1, are connected at node 214. In this example, inverter 212 comprises a PFET, MP2, and an NFET, MN2. The gates, 214, of PFET, MP2, and NFET, MN2, are connected. The source of PFET, MP2, is connected to VDD and the source of NFET, MN2, is connected to GND. The drains of PFET, MP2, and NFET, MN2, are connected at node 206. Inverter 216 comprises a PFET, MP3, and an NFET, MN3. The gates of PFET, MP3, and NFET, MN3, are connected at node 214. The source of PFET, MP3, is connected to VDD. The source of NFET, MN3, is connected to ground. The drains of PFET, MP3, and NFET, MN3, are connected at node 218. In this example, inverter, 216, forward inverter, 210, and feedback keeper, 212, were implemented using PFETs and NFETs. Other implementations may be used.

After control signal, 202, is turned off, the original logical value on node 206 of the latch, 108, is usually retained. If, however, a soft error event disturbs the charge stored on the node 206, the original signal may be lost because the feedback inverter, 212, is not strong enough to recover node 206 to its original logical value. Also, the output, 218, of inverter, 216, may be changed from its original logical value. If, for example, a soft error event disturbs the charge stored on node, 214, the original value may be lost because the feedback inverter, 212, drives node 206 to a value different from its original value. Also, the output, 218, of inverter, 216, may be changed from its original logical value. If the drive strength of feedback inverter, 212, is increased, and a soft error disturbs node 206, the probability that node 206 will change from its original value is decreased. However, if the driver strength of feedback inverter, 212, is increased, and a soft error disturbs node 214, the probability that node 206 will change from its original value is increased. In addition, because the drive strength of the feedback inverter, 212, has been increased, the write time of the latch 208 may be increased.

Figure 8:
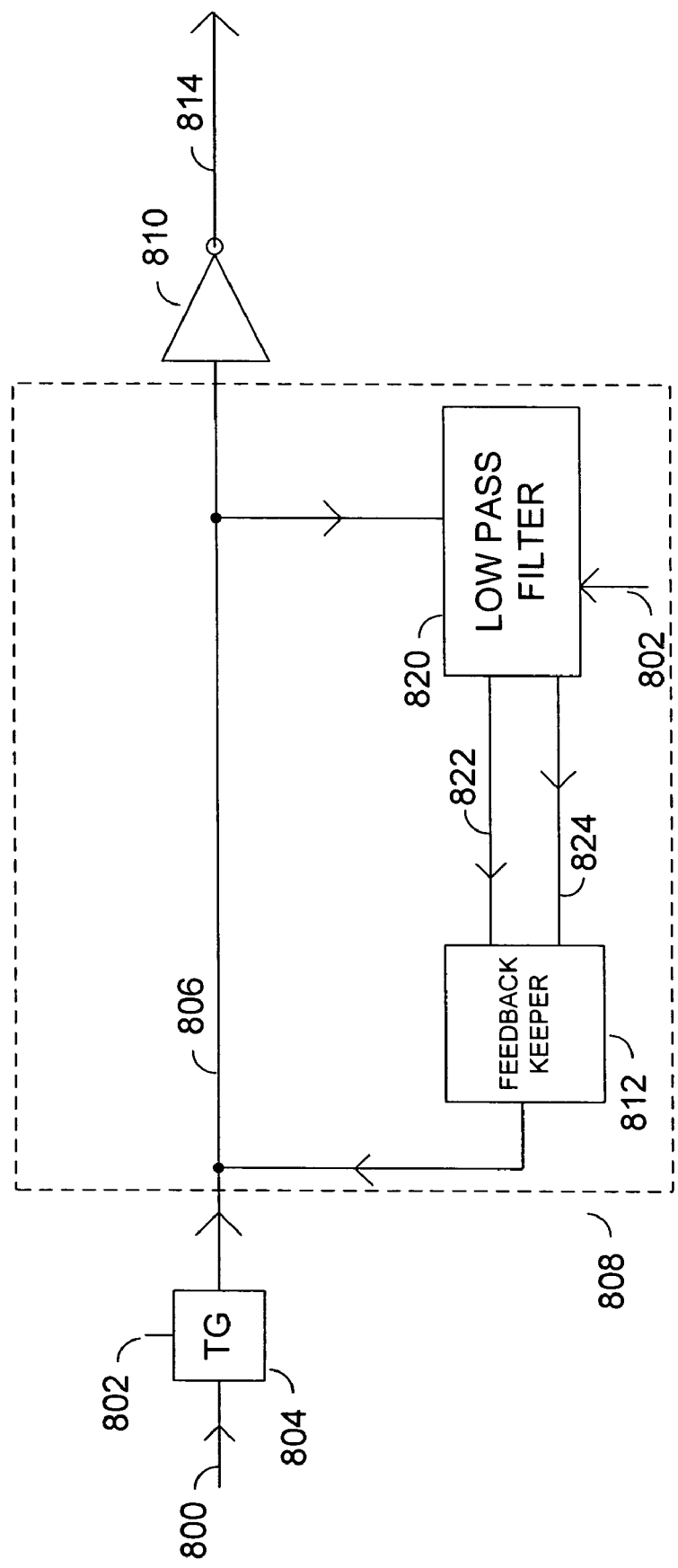
FIG. 8 is a schematic diagram of an example of a transfer gate, a latch and an inverter.

FIG. 8 is a schematic diagram of an example of a transfer gate, 804, a latch, 808, and an inverter, 810. An input, 800, is connected to the input of transfer gate, 804. The output, 806, of the transfer gate, 804, is connected to the input, 806 of the latch, 308. Control signal, 802, controls when the signal on the input, 800, of the transfer gate, 804, is transferred to the output, 806, of the transfer gate, 804 and when the low-pass filter, 820, tristates the output of the feedback keeper, 812. The signal presented at the output, 806, is stored on the latch, 808. In this example, a latch comprises a low-pass filter, 820, and a feedback keeper, 812, where the input/output, 806, of the latch, 808, is connected to the input, 806, of the low-pass filter, 820. The first output, 822, of the low-pass filter, 820, is connected to the first input, 822, of the feedback keeper, 812. The second output, 824, of the low-pass filter, 820, is connected to the second input, 824, of the feedback keeper, 812. The output, 806, of the feedback keeper, 812, is connected to the input/output, 806, of the latch, 808. The only type of diffusions connected to node 822 is P-type diffusions. The only type of diffusions connected to node 824 is N-type diffusions. The feedback keeper, 812, in this example, has drive strength greater than that required to make up for leakages on node 806. The greater drive strength of the feedback keeper, 812, allows node 806 to be recovered faster after a soft error event disturbs the charge on node 806.

Figure 6:
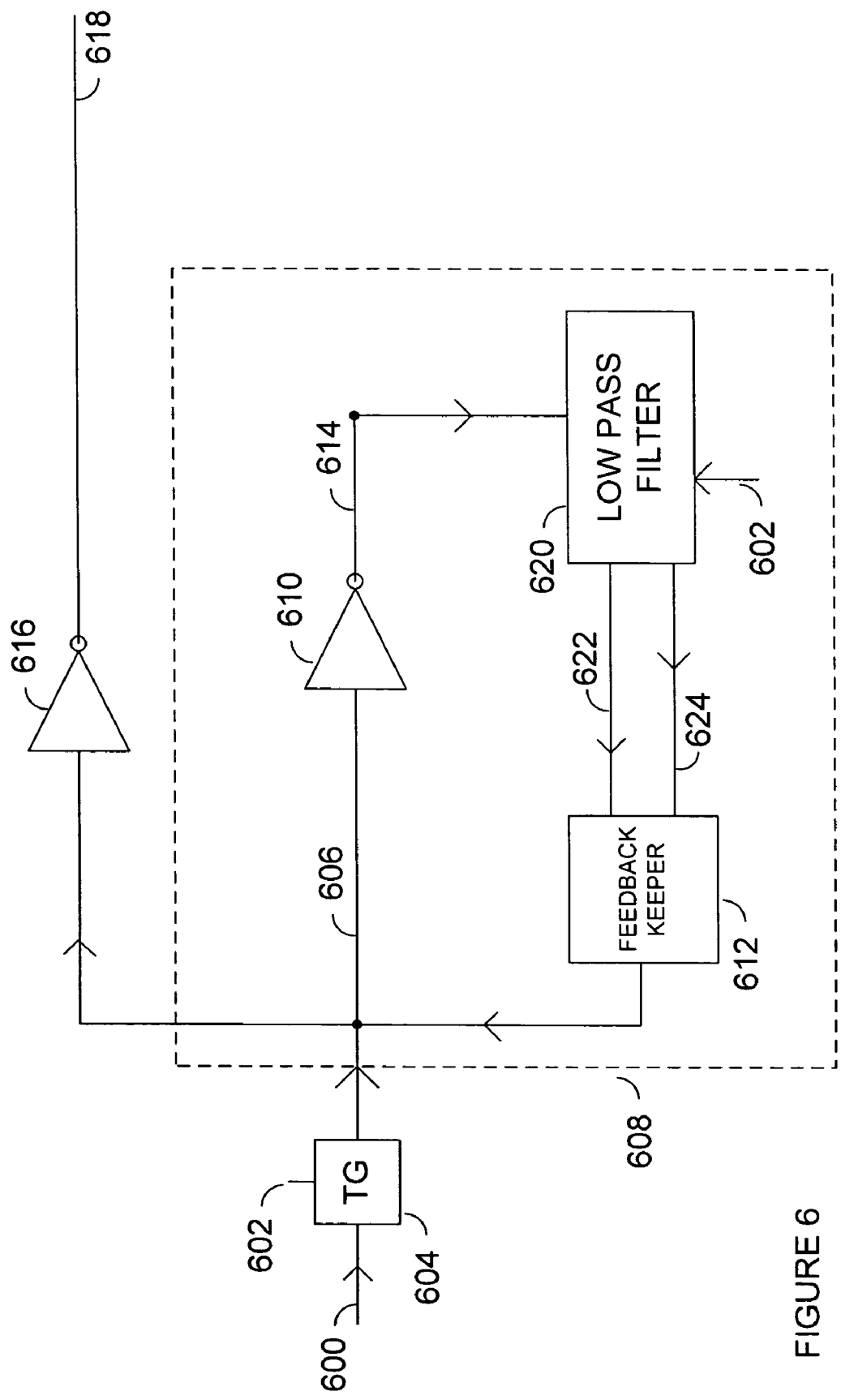
FIG. 6 is a schematic diagram of an example of a transfer gate and a latch.

FIG. 6 is a schematic diagram of a transfer gate, 604, a latch, 608, and an inverter, 616. An input, 600, is connected to the input of transfer gate, 604. The output, 606, of the transfer gate, 604, is connected to the input of the latch, 608, and the input of the inverter 616. Control signal, 602, controls when the signal on the input, 600, of the transfer gate, 604, is transferred to the output, 606, of the transfer gate, 604 and when the low-pass filter, 620, tristates the output of the feedback keeper, 612. The signal presented at the output, 606, is stored on the latch, 608. The logical value, 606, stored on the latch, 608, drives the input of the inverter, 616. In this example, the output, 618, of the inverter, 616, has the opposite sense of the signal stored on the latch, 608. In this example, a latch comprises a forward inverter, 610, a low-pass filter, 620, and a feedback keeper, 612, where the output, 614, of the forward inverter, 610, is connected to the input, 614, of the low-pass filter, 620. The first output, 622, of the low-pass filter, 620, is connected to the first input, 622, of the feedback keeper, 612. The second output, 624, of the low-pass filter, 620, is connected to the second input, 624, of the feedback keeper, 612. The output, 606, of the feedback keeper, 612, is connected to the input, 606, of the forward inverter, 610 and the input of inverter 616. The only type of diffusions connected to node 622 is P-type diffusions. The only type of diffusions connected to node 624 is N-type diffusions. The feedback keeper, 612, in this example, has drive strength greater than that required to make up for leakages on node 606. The greater drive strength of the feedback keeper, 612, allows node 606 to be recovered faster after a soft error event disturbs the charge on node 606.

Figure 5:
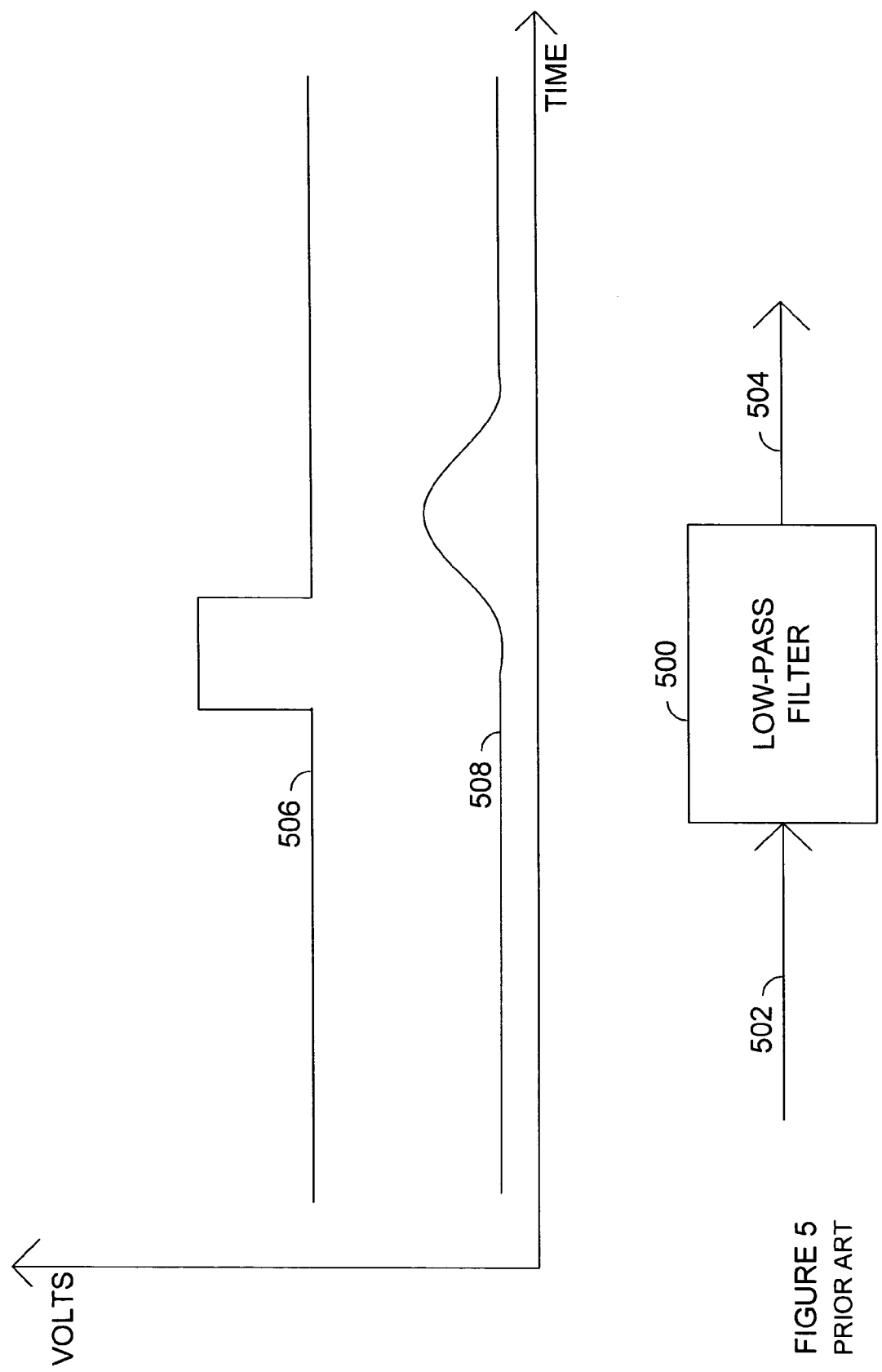
FIG. 5 is a plot of the input and output of a low-pass filter. Prior Art

FIG. 5 is a plot of the input and output of an example low-pass filter. In this example of a low-pass filter, a square wave signal, 506, is applied to the input, 502, of the low-pass filter. The resulting output, 504, of the low-pass filter, is the waveform, 508. The resulting waveform, 508, is delayed in time from the original square wave signal, 506. In addition, the high frequencies components are removed from the resulting waveform, 508, and the voltage amplitude is reduced.

After writing a logical value to the latch, 608, control signal, 602, is turned off, and the signal, 606 on latch, 608, is usually retained. If a soft error event disturbs the charge stored on node 606, the feedback keeper, 612 because of its greater drive strength, can recover node 606 to its original value.

For example, if the latch, 608, has a logical one stored on it and transfer gate, 604, is off, node 606 is a logical high value, node 618 is a logical low value, and node 614 is a logical low value. The low-pass filter 620 drives nodes 622 and 624 to a logical low value. The logical low value on node 622 causes the feedback keeper, 612, to reinforce the logical high value on node 606.

In this example, if a soft error event disturbs node 606 from a logical high value to a logical low value, node 606 will be recovered to logical high value if the time delay from node 606 to nodes 622 and 624 is longer than the time it takes the feedback keeper, 612 to recover node 606 to a high value. When node 606 transitions low, due to the soft error event, node 614 transitions high. The high transition on node 614 is driven into the low-pass filter, 620. The low-pass filter, 620, delays and reduces the voltage amplitude of the high transition on node 614. Because the low-pass filter, 620, delays and reduces the voltage amplitude of the high transition on node 614, the voltage presented to node 622 is delayed long enough to allow the feedback keeper, 612, to recover node 606 to its original value. Because the low-pass filter, 620, delays and reduces the voltage amplitude of the high transition on node 614, the voltage presented to node 624 is delayed long enough to allow the feedback keeper, 612, to recover node 606 to its original value.

After writing a value to the latch, 608, control signal, 602, is turned off, and the signal, 606 on latch, 608, is usually retained. If a soft error event occurs near nodes 622 and 624, the feedback keeper, 612 does not change the logical value on node 606 because the only diffusions on node 622 are P-type diffusions and the only diffusions on node 624 are N-type diffusions. Because the only diffusions on node 622 are P-type diffusions, the only charge carriers collected on node 622 are positive. Because the only diffusions on node 624 are N-type diffusions, the only charge carriers collected on node 624 are negative. Because node 622 only collects positive charge carriers and node 624 only collects negative charge carriers, the output of the feedback keeper, 612, is tristated. Since the output of the feedback keeper, 612, is tristated, and will eventually be returned to the original value by the low-pass filter, 620, the value on node 606 is not changed from its original value.

For example, if the latch, 608, has a logical one stored on it and transfer gate, 604, is off, node 606 is a logical high value, node 618 is a logical low value, and node 614 is a logical low value. The low-pass filter drives nodes 622 and 624 to a logical low value. The logical low value on node 622 cause the feedback keeper, 612, to reinforce the logical high value on node 606.

In this example, if a soft error event occurs near nodes 622 and 624, node 622 may change from a low logical value to a high logical value. Node 624 will remain a low value. Because node 622 is high and node 624 is low, the output of the feedback keeper, 612, is tristated. Since the output of the feedback keeper, 612, is tristated, the logical high value originally stored on node 606 doesn't change. Because node 606 remains a high logical value, node 618 remains a low value and node 614 remains a low logical value. Since the input to the low-pass filter is low, after some delay in time, node 622 is driven to a low logical value and node 624 remains a low logical value. Because node 622 is a logical low value, the output of the feedback keeper, 612, drives node 606 high, reinforcing the original logical valued stored on node 606.

Figure 3:
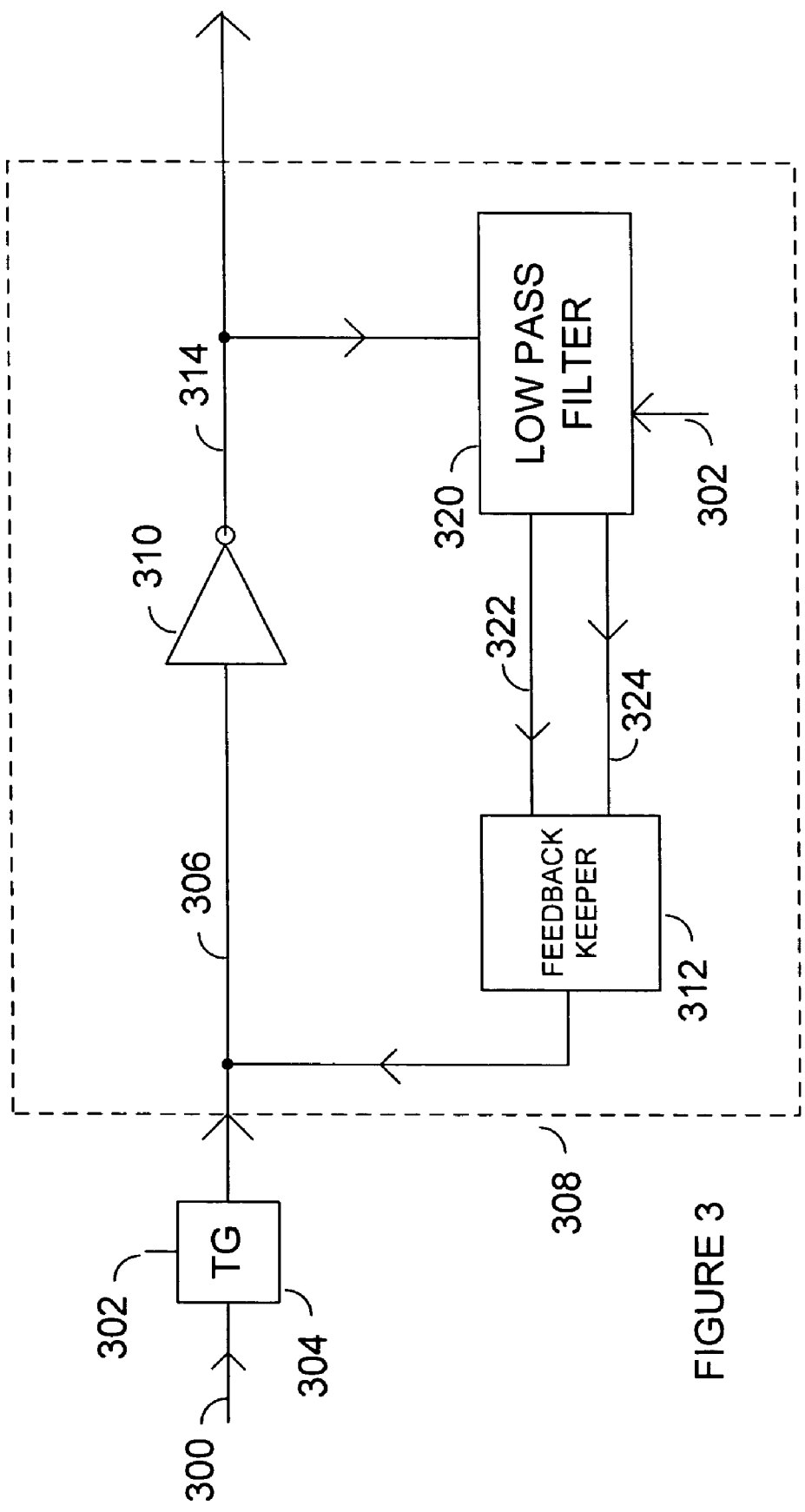
FIG. 3 is a schematic diagram of an example of a transfer gate and a latch.

FIG. 3 is a schematic diagram of an example of a transfer gate, 304, and a latch, 308. An input, 300, is connected to the input of transfer gate, 304. The output, 306, of the transfer gate, 304, is connected to the input of the latch, 308. Control signal, 302, controls when the signal on the input, 300, of the transfer gate, 304, is transferred to the output, 306, of the transfer gate, 304 and when the low-pass filter, 320, tristates the output of the feedback keeper, 312. The signal presented at the output, 306, is stored on the latch, 308. In this example, a latch comprises a forward inverter, 310, a low-pass filter, 320, and a feedback keeper, 312, where the output, 314, of the forward inverter, 310, is connected to the input, 314, of the low-pass filter, 320. The first output, 322, of the low-pass filter, 320, is connected to the first input, 322, of the feedback keeper, 312. The second output, 324, of the low-pass filter, 320, is connected to the second input, 324, of the feedback keeper, 312. The output, 306, of the feedback keeper, 312, is connected to the input, 306, of the forward inverter. The only type of diffusions connected to node 322 is P-type diffusions. The only type of diffusions connected to node 324 is N-type diffusions. The feedback keeper, 312, in this example, has drive strength greater than that required to make up for leakages on node 306. The greater drive strength of the feedback keeper, 312, allows node 306 to be recovered faster after a soft error event disturbs the charge on node 306.

FIG. 5 is a plot of the input and output of an example low-pass filter. In this example of a low-pass filter, a square wave signal, 506, is applied to the input, 502, of the low-pass filter. The resulting output, 504, of the low-pass filter, is the waveform, 508. The resulting waveform, 508, is delayed in time from the original square wave signal, 506. In addition, the high frequencies components are removed from the resulting waveform, 508, and the voltage amplitude is reduced.

After writing a logical value to the latch, 308, control signal, 302, is turned off, and the signal, 306 on latch, 308, is usually retained. If a soft error event disturbs the charge stored on node 306, the feedback keeper, 312 because of its greater drive strength, can recover node 306 to its original value.

For example, if the latch, 308, has a logical one stored on it and transfer gate, 304, is off, node 306 is a logical high value, and node 314 is a logical low value. The low-pass filter drives nodes 322 and 324 to a logical low value. The logical low value on node 322 cause the feedback keeper, 312, to reinforce the logical high value on node 306.

In this example, if a soft error event disturbs node 306 from a logical high value to a logical low value, node 306 will be recovered to logical high value if the time delay from node 306 to nodes 322 and 324 is longer than the time it takes the feedback keeper, 312 to recover node 306 to a high value. When node 306 transitions low, due to the soft error event, node 314 transitions high. The high transition on node 314 is driven into the low-pass filter, 320. The low-pass filter, 320, delays and reduces the voltage amplitude of the high transition on node 314. Because the low-pass filter, 320, delays and reduces the voltage amplitude of the high transition on node 314, the voltage presented to node 322 is delayed long enough to allow the feedback keeper, 312, to recover node 306 to its original value. Because the low-pass filter, 320, delays and reduces the voltage amplitude of the high transition on node 314, the voltage presented to node 324 is delayed long enough to allow the feedback keeper, 312, to recover node 306 to its original value.

After writing a value to the latch, 308, control signal, 302, is turned off, and the signal, 306 on latch, 308, is usually retained. If a soft error event occurs near nodes 322 and 324, the feedback keeper, 312 does not change the logical value on node 306 because the only diffusions on node 322 are P-type diffusions and the only diffusions on node 324 are N-type diffusions. Because the only diffusions on node 322 are P-type diffusions, the only charge carriers collected on node 322 are positive. Because the only diffusions on node 324 are N-type diffusions, the only charge carriers collected on node 324 are negative. Because node 322 only collects positive charge carriers and node 324 only collects negative charge carriers, the output of the feedback keeper, 312, is tristated. Since the output of the feedback keeper, 312, is tristated, and will eventually be returned to the correct state by the low-pass filter, 320, the value on node 306 is not changed from its original value.

For example, if the latch, 308, has a logical one stored on it and transfer gate, 304, is off, node 306 is a logical high value, and node 314 is a logical low value. The low-pass filter drives nodes 322 and 324 to a logical low value. The logical low value on node 322 cause the feedback keeper, 312, to reinforce the logical high value on node 306.

In this example, if a soft error event occurs near nodes 322 and 324, node 322 may change from a low logical value to a high logical value. Node 324 will remain a low value. Because node 322 is high and node 324 is low, the output of the feedback keeper, 312, is tristated. Since the output of the feedback keeper, 312, is tristated, the logical high value originally stored on node 306 doesn't change. Because node 306 remains a high logical value, and node 314 remains a low logical value. Since the input to the low-pass filter is low, after some delay in time, node 322 is driven to a low logical value and node 324 remains a low logical value. Because node 322 is a logical low value, the output of the feedback keeper, 312, drives node 306 high, reinforcing the original logical valued stored on node 306.

Figure 4:
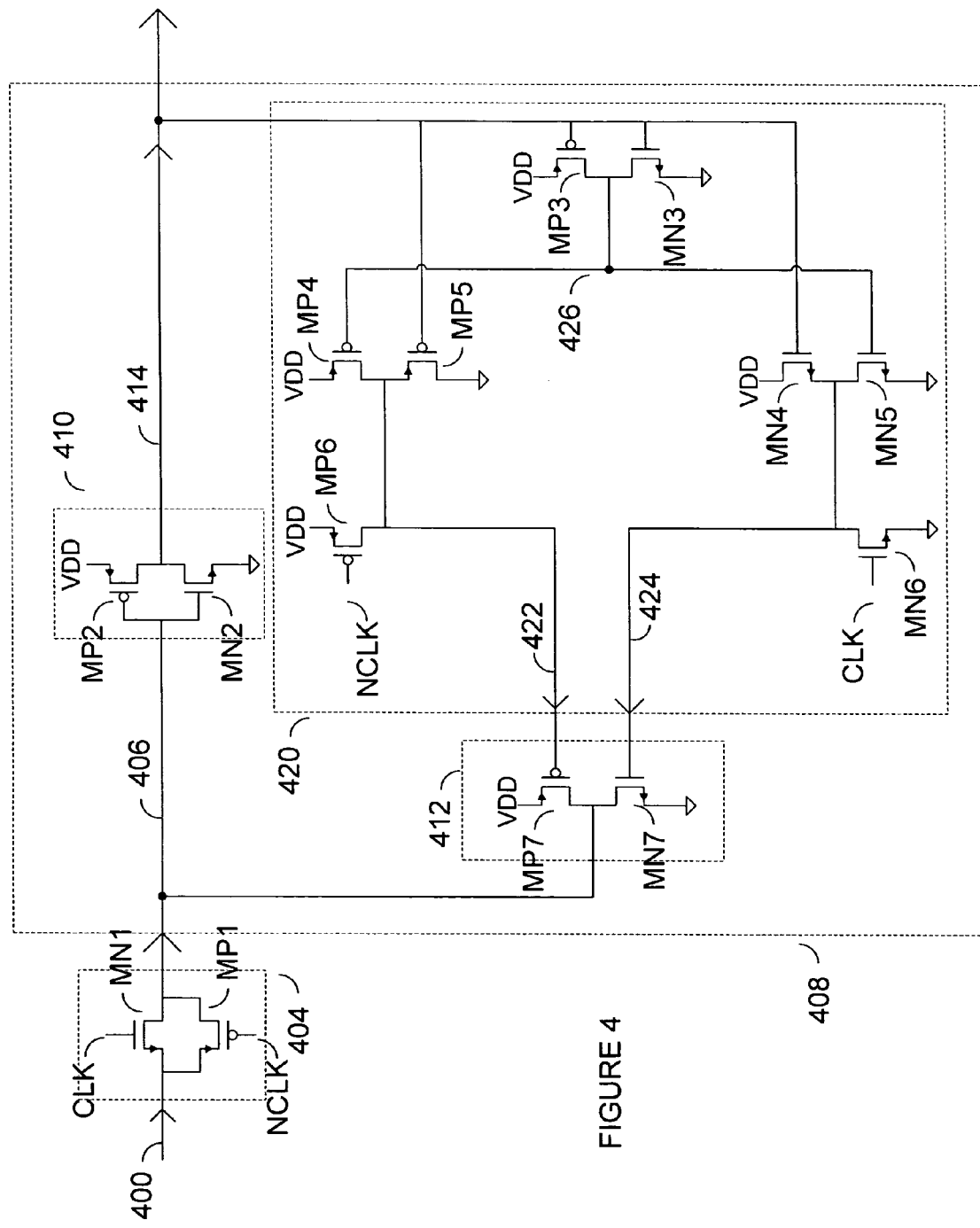
FIG. 4 is a schematic diagram of an example of a transfer gate, and a latch.

FIG. 4 is a schematic diagram of an example of a transfer gate, 404, and a latch, 408. An input, 400, is connected to the input of transfer gate, 404. The output, 406, of the transfer gate, 404, is connected to the input, 406 of the latch, 408. Control signals, CLK and NCLK, control when the signal on the input, 400, of the transfer gate, 404, is transferred to the output, 406, of the transfer gate, 404 and when the output of the feedback inverter, 412, is tristated or not. The logical value presented at the input, 406, is stored on the latch, 408.

In this example, a latch, 408, comprises a forward inverter, 410, a low-pass filter, 420, and a feedback keeper, 412, where the output, 414, of the forward inverter, 410, is connected to input, 414, of the low-pass filter, 420. The outputs, 422 and 424, of the low-pass filter, 420 are connected to the inputs, 422 and 424, of the feedback keeper, 412. The output, 406, of the feedback keeper, 412, is connected to the input, 406, of the forward inverter. CLK and NCLK are connected to inputs of the low-pass filter, 420. The only type of diffusions connected to node 422 is P-type diffusions. The only type of diffusions connected to node 424 is N-type diffusions. The feedback keeper, 412, in this example, has drive strength greater than that required to make up for leakages on node 406. The greater drive strength of the feedback keeper, 412, allows node 406 to be recovered faster after a soft error event disturbs the charge on node 406.

In this example, forward inverter 410 comprises a PFET, MP2, and an NFET, MN2. The gates, 406, of PFET, MP2, and NFET, MN2, are connected. The source of PFET, MP2, is connected to VDD and the source of NFET, MN2, is connected to GND. The drains of PFET, MP2, and NFET, MN2, are connected at node 414. In this example, feedback keeper 412 comprises a PFET, MP7, and an NFET, MN7. The gate, 422, of PFET, MP7, is connected to an input of the feedback keeper 412. The gate, 424, of NFET, MN7, is connected to an input of the feedback keeper 412. The source of PFET, MP7, is connected to VDD and the source of NFET, MN7, is connected to GND. The drains of PFET, MP7, and NFET, MN7, are connected at node 406. In this example, the transfer gate, 404 comprises a PFET, MP1, and an NFET, MN1. The gate, NCLK, of PFET, MP1, is connected to signal, NCLK. The gate, CLK, of NET, MN1, is connected to signal CLK. The drains, 400, of PFET, MP1, and NFET, MN1, are connected. The sources, 406, of PFET, MP1, and NFET, MN1, are connected.

In this example, the low-pass filter comprises PFET, MP3, NFET, MN3, PFET, MP4, NFET, MN4, PFET, MP5, NFET, MN5, PFET, MP6, and NFET, MN6. The gates of PFET, MP3, NFET, MN3, MP5, PFET, MP5, and NFET, MN5 are connected to node 414. The source of PFET, MP3, is connected to VDD and the source of NFET, MN3, is connected to GND. The drains of PFET, MP3, and NFET, MN3, and the gates of PFET, MP4 and NFET, MN4 are connected at node 426. The source of PFET, MP4, the source of PFET, MP6, and the drain of NFET, MN4 are connected to VDD. The drain of PFET, MP5, the source of NFET, MN5, and the source of NFET, MN6 are connected to GND. The drain of PFET, MP4, the drain of PFET, MP6, and the source of PFET, MP5, are connected to node 422. The drain of NFET, MN5, the drain of NFET, MN6, and the source of NFET, MP4, are connected to node 424.

After writing a logical value to the latch, 408, control signal, CLK, is driven to a logical low value and control signal, NCLK, is driven to a logical high value, and the logical value, 406, stored on latch, 408, is usually retained. If a soft error event disturbs the charge stored on node 406, the feedback keeper, 412, because of its greater drive strength, can recover node 406 to its original value.

For example, if the latch, 408, has a logical one stored on it and signal CLK is low and signal NCLK is high, node 406 is a logical high value, and node 414 is a logical low value. The low-pass filter drives nodes 422 and 424 to a logical low value. The logical low value on node 422 causes the feedback keeper, 412, to reinforce the logical high value on node 406.

In this example, if a soft error event disturbs node 406 from a logical high value to a logical low value, node 406 will be recovered to logical high value if the delay from node 406 to nodes 422 and 424 is longer than the time it takes the feedback keeper to recover node 406 to a high value. When node 406 transitions low, due to the soft error event, node 414 transitions high. The high transition on node 414 is driven into the low-pass filter, 420. The low-pass filter, 420, delays and reduces the voltage amplitude of the high transition on node 414. Because the low-pass filter, 420, delays and reduces the voltage amplitude of the high transition on node 414, the voltage presented to node 422 is delayed long enough to allow the feedback keeper, 412, to recover node 406 to its original value. Because the low-pass filter, 420, delays and reduces the voltage amplitude of the high transition on node 414, the voltage presented to node 424 is delayed long enough to allow the feedback keeper, 412, to recover node 406 to its original value.

After writing a value to the latch, 408, control signal, CLK, is driven low, and control signal NCLK is driven high and the signal, 406 on latch, 408, is usually retained. If a soft error event occurs near nodes 422 and 424, the feedback keeper, 412 does not change the logical value on node 406 because the only diffusions on node 422 are P-type diffusions and the only diffusions on node 424 are N-type diffusions. Because the only diffusions on node 422 are P-type diffusions, the only charge carriers collected on node 422 are positive. Because the only diffusions on node 424 are N-type diffusions, the only charge carriers collected on node 424 are negative. Because node 422 only collects positive charge carriers and node 424 only collects negative charge carriers, the output of the feedback keeper, 412, is tristated. Since the output of the feedback keeper, 412, is tristated, the value on node 406 is not changed from its original value.

For example, if the latch, 408, has a logical one stored on it and control signal, CLK, is a logical low value, and control signal, NCLK, is a logical high value, node 406 is a logical high value, and node 414 is a logical low value. The low-pass filter drives nodes 422 and 424 to a logical low value. The logical low value on node 422 cause the feedback keeper, 412, to reinforce the logical high value on node 406.

In this example, if a soft error event occurs near nodes 422 and 424, node 422 may change from a low logical value to a high logical value. Node 424 will remain a low value. Because node 422 is high and node 424 is low, the output of the feedback keeper, 412, is tristated. Since the output of the feedback keeper, 412, is tristated, the logical high value original stored on node 406 doesn't change. Because node 406 remains a high logical value, node 414 remains a low logical value. Since the input to the low-pass filter is low, after some delay in time, node 422 is driven to a low logical value and node 424 remains a low logical value. Because node 422 is a logical low value, the output of the feedback keeper, 412, drives node 406 high, reinforcing the original logical valued stored on node 406.

Figure 7:
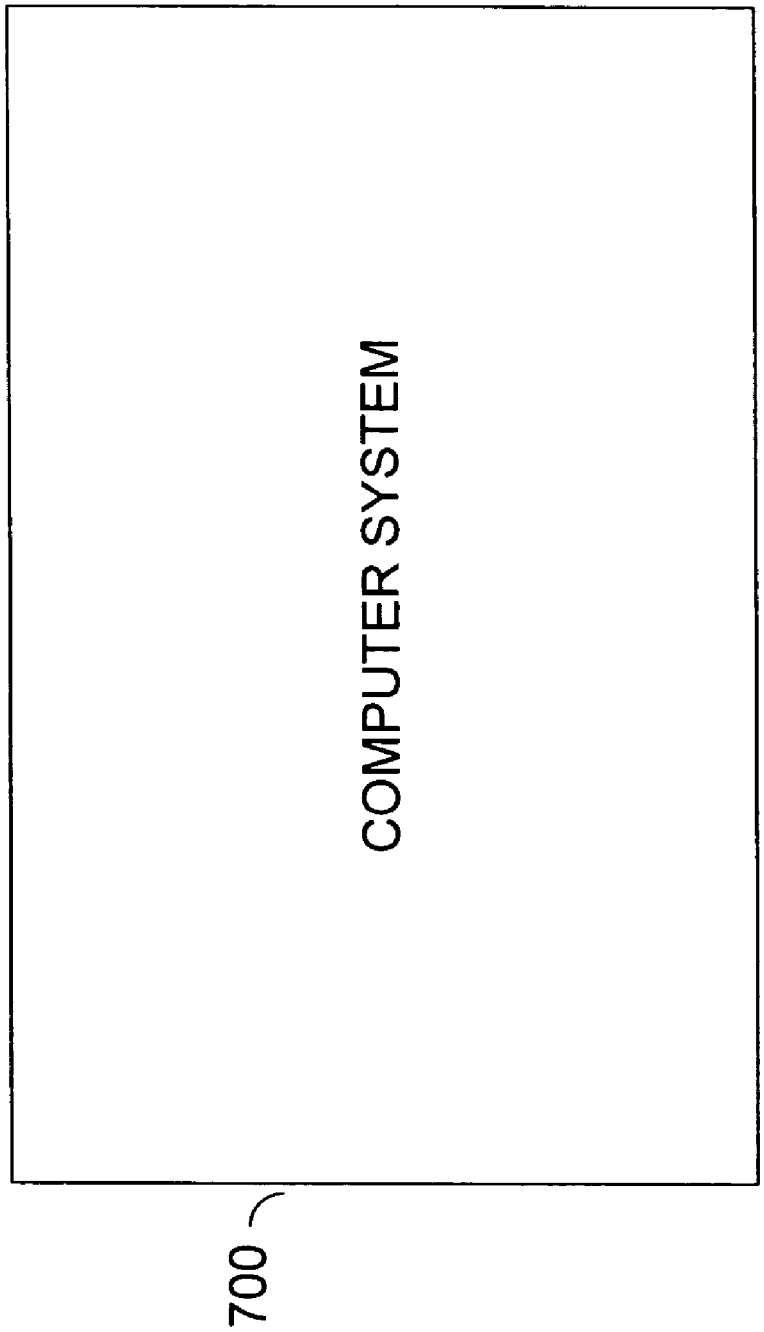
FIG. 7 is a drawing of a computer system containing an example of a transfer gate and a latch.

FIG. 7 is a drawing of a computer system containing an example of a transfer gate and a latch. In this example, a computer system is represented by block 700. In this example, the computer system contains at least one integrated circuit that contains at least one example of the latch, 408.

The foregoing description of the present invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A method of manufacturing a latch comprising:
  a) connecting a low-pass filter between an output of a forward inverter and inputs of a feedback keeper;
  b) connecting a first output of the low-pass filter to a first input of the feedback keeper;
  c) connecting a second output of the low-pass filter to a second input of the feedback keeper;
  d) such that the only type of diffusion attached to the first output of the low-pass filter is a P-type diffusion;
  e) such that the only type of diffusion attached to the second output of the low-pass filter is an N-type diffusion;
  f) wherein an output of the feedback keeper is connected to an input of the forward inverter.

2. The method as in claim 1 wherein the forward inverter comprises:
  a) a PFET, the PFET having a gate, drain, and source;
  b) an NFET, the NFET having a gate, drain, and source;
  c) wherein the gates of the PFET and NFET are connected to the input of the forward inverter;
  d) wherein the drains of the PFET and NFET are connected to the output of the forward inverter;
  e) wherein the source of the PFET is connected to VDD;
  f) wherein the source of the NFET is connected to GND.

3. The method as in claim 1 wherein the low-pass filter comprises:
  a) a inverter, the inverter having an input and an output;
  b) a first PFET, the first PFET having a gate, drain, and source;
  c) a second PFET, the second PFET having a gate, drain, and source;
  d) a third PFET, the third PFET having a gate, drain, and source;
  e) a first NFET, the first NFET having a gate, drain, and source;
  f) a second NFET, the second NFET having a gate, drain, and source;
  g) a third NFET, the third NFET having a gate, drain, and source;
  h) wherein the input of the low-pass filter is connected to the input of the inverter and the gates of the second PFET and the first NFET;
  i) wherein the output of the inverter is connected to the gates of the first PFET and the second NFET;
  j) wherein the sources of the first PFET, and the third PFET are connected to VDD;
  k) wherein the drain of the first NFET is connected to VDD;
  l) wherein the sources of the second NFET, and the third NFET are connected to GND;
  m) wherein the drain of the second PFET is connected to GND;
  n) wherein the gate of the third NFET is connected to a clock signal;
  o) wherein the gate of the third PFET is connected to the opposite phase of the clock signal;
  p) wherein the drains of the first PFET and third PFET and the source of the second PFET are connected to the first output of the low-pass filter;
  q) wherein the drains of the second NFET and third NFET and the source of the first NFET are connected to the second output of the low-pass filter.

4. The method as in claim 3 wherein the inverter comprises:
  a) a PFET, the PFET having a gate, drain, and source;
  b) an NFET, the NFET having a gate, drain, and source;
  c) wherein the gates of the PFET and NFET are connected to the input of the inverter;
  d) wherein the drains of the PFET and NFET are connected to the output of the inverter;
  e) wherein the source of the PFET is connected to VDD;
  f) wherein the source of the NFET is connected to GND.

5. The method as in claim 1 wherein the feedback keeper comprises:
  a) a PFET, the PFET having a gate, drain, and source;
  b) an NFET, the NFET having a gate, drain, and source;
  c) wherein the gate of the PFET is connected to the first input of the feedback keeper;
  d) wherein the gate of the NFET is connected to the second input of the feedback keeper;
  e) wherein the drains of the PFET and NFET are connected to the output of the feedback keeper;
  f) wherein the source of the PFET is connected to VDD;
  g) wherein the source of the NFET is connected to GND.

6. A latch comprising:
  a) a forward inverter;
  b) a feedback keeper;
  c) a low-pass filter;

d) wherein an output of the forward inverter is connected to an input of the low-pass filter;
e) wherein a first output of the low-pass filter is connected to a first input of the feedback keeper;
f) such that the only type of diffusion attached to the first output of the low-pass filter is a P-type diffusion;
g) wherein a second output of the low-pass filter is connected to a second input of the feedback keeper;
h) such that the only type of diffusion attached to the second output of the low-pass filter is an N-type diffusion;
i) wherein an output of the feedback keeper is connected to the input of the forward inverter.

7. The latch as in claim 6 wherein the forward inverter comprises:
a) a PFET, the PFET having a gate, drain, and source;
b) an NFET, the NFET having a gate, drain, and source;
c) wherein the gates of the PFET and NFET are connected to the input of the forward inverter;
d) wherein the drains of the PFET and NFET are connected to the output of the forward inverter;
e) wherein the source of the PFET is connected to VDD;
f) wherein the source of the NFET is connected to GND.

8. The latch as in claim 6 wherein the low-pass filter comprises:
a) a inverter, the inverter having an input and an output;
b) a first PFET, the first PFET having a gate, drain, and source;
c) a second PFET, the second PFET having a gate, drain, and source;
d) a third PFET, the third PFET having a gate, drain, and source;
e) a first NFET, the first NFET having a gate, drain, and source;
f) a second NFET, the second NFET having a gate, drain, and source;
g) a third NFET, the third NFET having a gate, drain, and source;
h) wherein the input of the low-pass filter is connected to the input of the inverter and the gates of the second PFET and the first NFET;
i) wherein the output of the inverter is connected to the gates of the first PFET and the second NFET;
j) wherein the sources of the first PFET, and the third PFET are connected to VDD;
k) wherein the drain of the first NFET is connected to VDD;
l) wherein the sources of the second NFET, and the third NFET are connected to GND;
m) wherein the drain of the second PFET is connected to GND;
n) wherein the gate of the third NFET is connected to a clock signal;
o) wherein the gate of the third PFET is connected to the opposite phase of the clock signal;
p) wherein the drains of the first PFET and third PFET and the source of the second PFET are connected to the first output of the low-pass filter;
q) wherein the drains of the second NFET and third NFET and the source of the first NFET are connected to the second output of the low-pass filter.

9. The latch as in claim 8 wherein the inverter comprises:
a) a PFET, the PFET having a gate, drain, and source;
b) an NFET, the NFET having a gate, drain, and source;
c) wherein the gates of the PFET and NFET are connected to the input of the inverter;
d) wherein the drains of the PFET and NFET are connected to the output of the inverter;
e) wherein the source of the PFET is connected to VDD;
f) wherein the source of the NFET is connected to GND.

10. The latch as in claim 6 wherein the feedback keeper comprises:
a) a PFET, the PFET having a gate, drain, and source;
b) an NFET, the NFET having a gate, drain, and source;
c) wherein the gate of the PFET is connected to the first input of the feedback keeper;
d) wherein the gate of the NFET is connected to the second input of the feedback keeper;
e) wherein the drains of the PFET and NFET are connected to the output of the feedback keeper;
f) wherein the source of the PFET is connected to VDD;
g) wherein the source of the NFET is connected to GND.

11. A computer system, comprising:
a) at least one integrated circuit;
b) wherein at least one integrated circuit contains a latch;
c) wherein the latch comprises a forward inverter, a low-pass filter, and a feedback keeper;
d) such that the only type of diffusion attached to a first output of the low-pass filter is a P-type diffusion;
e) such that the only type of diffusion attached to a second output of the low-pass filter is an N-type diffusion.

12. The computer system as in claim 11 wherein the forward inverter comprises:
a) a PFET, the PFET having a gate, drain, and source;
b) an NFET, the NFET having a gate, drain, and source;
c) wherein the gates of the PFET and NFET are connected to the input of the forward inverter;
d) wherein the drains of the PFET and NFET are connected to the output of the forward inverter;
e) wherein the source of the PFET is connected to VDD;
f) wherein the source of the NFET is connected to GND.

13. The computer system as in claim 11 wherein the low-pass filter comprises:
a) a inverter, the inverter having an input and an output;
b) a first PFET, the first PFET having a gate, drain, and source;
c) a second PFET, the second PFET having a gate, drain, and source;
d) a third PFET, the third PFET having a gate, drain, and source;
e) a first NFET, the first NFET having a gate, drain, and source;
f) a second NFET, the second NFET having a gate, drain, and source;
g) a third NFET, the third NFET having a gate, drain, and source;
h) wherein the input of the low-pass filter is connected to the input of the inverter and the gates of the second PFET and the first NFET;
i) wherein the output of the inverter is connected to the gates of the first PFET and the second NFET;
j) wherein the sources of the first PFET, and the third PFET are connected to VDD;
k) wherein the drain of the first NFET is connected to VDD;
l) wherein the sources of the second NFET, and the third NFET are connected to GND;
m) wherein the drain of the second PFET is connected to GND;
n) wherein the gate of the third NFET is connected to a clock signal;
o) wherein the gate of the third PFET is connected to the opposite phase of the clock signal;

p) wherein the drains of the first PFET and third PFET and the source of the second PFET are connected to the first output of the low-pass filter;
q) wherein the drains of the second NFET and third NFET and the source of the first NFET are connected to the second output of the low-pass filter.

14. The computer system as in claim 13 wherein the inverter comprises:
a) a PFET, the PFET having a gate, drain, and source;
b) an NFET, the NFET having a gate, drain, and source;
c) wherein the gates of the PFET and NFET are connected to the input of the inverter;
d) wherein the drains of the PFET and NFET are connected to the output of the inverter;
e) wherein the source of the PFET is connected to VDD;
f) wherein the source of the NFET is connected to GND.

15. The computer system as in claim 11 wherein the feedback keeper comprises:
a) a PFET, the PFET having a gate, drain, and source;
b) an NFET, the NFET having a gate, drain, and source;
c) wherein the gate of the PFET is connected to the first input of the feedback keeper;
d) wherein the gate of the NFET is connected to the second input of the feedback keeper;
e) wherein the drains of the PFET and NFET are connected to the output of the feedback keeper;
f) wherein the source of the PFET is connected to VDD;
g) wherein the source of the NFET is connected to GND.

16. A latch for reducing soft errors comprising:
a) a means for inverting a signal, the means for inverting a signal having an input and an output;
b) a means for maintaining a logical value on a node, the means for maintaining a logical value on a node having a first input, a second input, and an output;
c) a means for filtering high frequency content from a signal, the means for filtering high frequency content from a signal having an input, a first output, and a second output;
d) such that the only type of diffusion attached to the first output of the means for filtering high frequency content from a signal is a P-type diffusion;
e) such that the only type of diffusion attached to the second output of the means for filtering high frequency content from a signal is an N-type diffusion;
f) wherein the output of the means for inverting a signal is connected to the input of the means for filtering high frequency content from a signal;
g) wherein the first output of the means for filtering high frequency content from a signal is connected to the first input of the means for maintaining a logical value on a node;

h) wherein the second output of the means for filtering high frequency content from a signal is connected to the second input of the means for maintaining a logical value on a node;
i) wherein the output of the means for maintaining a logical value on a node is connected to the input of the means for inverting a signal.

17. A method of manufacturing a latch comprising:
a) connecting a low-pass filter between an output of a transfer gate and inputs of a feedback keeper;
b) connecting a first output of the low-pass filter to a first input of the feedback keeper;
c) connecting a second output of the low-pass filter to a second input of the feedback keeper;
d) such that the only type of diffusion attached to the first output of the low-pass filter is a P-type diffusion;
e) such that the only type of diffusion attached to the second output of the low-pass filter is an N-type diffusion;
f) wherein an output of the feedback keeper is connected to the output of the transfer gate.

18. A latch comprising:
a) a feedback keeper;
b) a low-pass filter;
c) wherein an input/output of the latch is connected to an input of the low-pass filter;
d) wherein a first output of the low-pass filter is connected to a first input of the feedback keeper;
e) such that the only type of diffusion attached to the first output of the low-pass filter is a P-type diffusion;
f) wherein a second output of the low-pass filter is connected to a second input of the feedback keeper;
g) such that the only type of diffusion attached to the second output of the low-pass filter is an N-type diffusion;
h) wherein an output of the feedback keeper is connected to the input/output of the latch.

19. A computer system, comprising:
a) at least one integrated circuit;
b) wherein at least one integrated circuit contains a latch;
c) wherein the latch comprises a low-pass filter, and a feedback keeper;
d) such that the only type of diffusion attached to a first output of the low-pass filter is a P-type diffusion;
e) such that the only type of diffusion attached to a second output of the low-pass filter is an N-type diffusion.

* * * * *

UNITED STATES PATENT AND TRADEMARK OFFICE
CERTIFICATE OF CORRECTION

| | | |
|---|---|---|
| PATENT NO. | : 7,323,920 B2 | |
| APPLICATION NO. | : 11/152274 | |
| DATED | : January 29, 2008 | |
| INVENTOR(S) | : Samuel D. Naffziger | |

It is certified that error appears in the above-identified patent and that said Letters Patent is hereby corrected as shown below:

In column 9, line 53, in Claim 1, after "diffusion" insert -- directly --.

In column 9, line 55, in Claim 1, after "diffusion" insert -- directly --.

In column 11, line 5, in Claim 6, after "diffusion" insert -- directly --.

In column 11, line 9, in Claim 6, after "diffusion" insert -- directly --.

In column 12, line 22, in Claim 11, after "diffusion" insert -- directly --.

In column 12, line 24, in Claim 11, after "diffusion" insert -- directly --.

In column 13, line 39, in Claim 16, after "diffusion" insert -- directly --.

In column 13, line 42, in Claim 16, after "diffusion" insert -- directly --.

In column 14, line 16, in Claim 17, after "diffusion" insert -- directly --.

In column 14, line 18, in Claim 17, after "diffusion" insert -- directly --.

In column 14, line 31, in Claim 18, after "diffusion" insert -- directly --.

In column 14, line 35, in Claim 18, after "diffusion" insert -- directly --.

UNITED STATES PATENT AND TRADEMARK OFFICE
CERTIFICATE OF CORRECTION

PATENT NO.         : 7,323,920 B2
APPLICATION NO.    : 11/152274
DATED              : January 29, 2008
INVENTOR(S)        : Samuel D. Naffziger It is certified that error appears in the above-identified patent and that said Letters Patent is hereby corrected as shown below:

In column 14, line 45, in Claim 19, after "diffusion" insert -- directly --.

In column 14, line 47, in Claim 19, after "diffusion" insert -- directly --.

Signed and Sealed this

Third Day of June, 2008

JON W. DUDAS
*Director of the United States Patent and Trademark Office*